(12) United States Patent
Howard et al.

(10) Patent No.: US 6,894,366 B2
(45) Date of Patent: May 17, 2005

(54) BIPOLAR JUNCTION TRANSISTOR WITH A COUNTERDOPED COLLECTOR REGION

(75) Inventors: Gregory E. Howard, Dallas, TX (US); Jeffrey Babcock, Dallas, TX (US); Angelo Pinto, Allen, TX (US); Scott Balster, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 164 days.

(21) Appl. No.: 09/967,187

(22) Filed: Sep. 28, 2001

(65) Prior Publication Data

US 2002/0041008 A1 Apr. 11, 2002

Related U.S. Application Data

(60) Provisional application No. 60/238,947, filed on Oct. 10, 2000.

(51) Int. Cl.[7] ................. H01L 27/082; H01L 27/102; H01L 29/70; H01L 31/11
(52) U.S. Cl. ................. 257/565; 257/557; 257/558; 257/559; 257/592
(58) Field of Search ................. 257/557–559, 257/565, 592

(56) References Cited

U.S. PATENT DOCUMENTS

| | | | | |
|---|---|---|---|---|
| 3,638,081 A | * | 1/1972 | Lloyd | 257/545 |
| 4,283,236 A | * | 8/1981 | Sirsi | 438/335 |
| 4,412,376 A | * | 11/1983 | De Bar et al. | 438/326 |
| 4,639,761 A | * | 1/1987 | Singer et al. | 257/336 |
| 4,721,684 A | | 1/1988 | Musumeci | |
| 4,873,199 A | | 10/1989 | Hunt | |
| 4,929,996 A | * | 5/1990 | Hutter | 257/552 |
| 4,980,747 A | * | 12/1990 | Hutter et al. | 257/513 |
| 4,983,531 A | * | 1/1991 | Cosentino | 438/202 |
| 5,025,293 A | | 6/1991 | Seki | |
| 5,065,209 A | * | 11/1991 | Spratt et al. | 257/588 |
| 5,117,274 A | * | 5/1992 | Mastroianni | 257/370 |
| 5,198,692 A | * | 3/1993 | Momose | 257/591 |
| 5,311,054 A | * | 5/1994 | DeJong et al. | 257/565 |
| 5,331,198 A | * | 7/1994 | Kanda et al. | 257/555 |
| 5,341,022 A | | 8/1994 | Kuroi et al. | |
| 5,420,050 A | * | 5/1995 | Jerome et al. | 438/365 |
| 5,439,833 A | * | 8/1995 | Hebert et al. | 438/203 |
| 5,652,456 A | * | 7/1997 | Lien | 257/370 |
| 5,882,966 A | * | 3/1999 | Jang | 438/234 |
| 5,933,034 A | * | 8/1999 | Hastings et al. | 327/108 |
| 6,001,701 A | * | 12/1999 | Carroll et al. | 438/364 |
| 6,124,180 A | * | 9/2000 | Chambers et al. | 438/350 |
| 6,284,581 B1 | * | 9/2001 | Pan et al. | 438/202 |
| 6,346,452 B1 | * | 2/2002 | Kabir et al. | 438/312 |
| 6,346,453 B1 | * | 2/2002 | Kovacic et al. | 438/312 |
| 2002/0105054 A1 | * | 8/2002 | Tsai et al. | 257/565 |

FOREIGN PATENT DOCUMENTS

| | | |
|---|---|---|
| DE | 35 45 040 | 7/1995 |
| DE | 197 26 126 | 12/1998 |

* cited by examiner

*Primary Examiner*—Amir Zarabian
*Assistant Examiner*—Ida M. Soward
(74) *Attorney, Agent, or Firm*—Peter K. McLarty; W. James Brady, III; Frederick J. Telecky, Jr.

(57) ABSTRACT

An improved BJT is described that maximizes both Bvceo and Ft/Fmax for optimum performance. Scattering centers are introduced in the collector region (80) of the BJT to improve Bvceo. The inclusion of the scattering centers allows the width of the collector region $W_{CD}$ (90) to be reduced leading to an improvement in Ft/Fmax.

5 Claims, 3 Drawing Sheets

BIPOLAR JUNCTION TRANSISTOR WITH A COUNTERDOPED COLLECTOR REGION

This application claims priority under 35 USC §119(e)(1) of provisional application Ser. No. 60/238,947, filed Oct. 10, 2000.

FIELD OF THE INVENTION

The present invention relates to improved bipolar junction transistor. In particular the breakdown voltage of the collector-base junction is improved while maintaining a high cutoff frequency and improving the maximum operating frequency.

BACKGROUND OF THE INVENTION

Shown in FIG. 1 is an integrated circuit bipolar junction transistor (BJT). In general a heavily doped buried layer 20 is formed in a silicon substrate 10 and will form the collector contact region of the transistor. An epitaxial layer 30 is then formed on the substrate 10 and the buried layer 20 to form the lightly doped or intrinsic collector region. Two diffusions 40 and 50 are formed in the epitaxial layer 30 to form the base region 40 and the emitter region 50 of the BJT. For a NPN BJT the substrate will be p-type. The buried layer 20 will be doped n+, the epitaxial layer will be lightly doped n-type, the first diffusion region 40 will be p-type, and the second diffusion region 50 will be doped n+. For a PNP BJT the substrate will n-type. The buried layer 20 will be doped p+, the epitaxial layer will be lightly doped p-type, the first diffusion region 40 will be n-type, and the second diffusion region 50 will be doped p+. In normal operation the emitter-base junction will be forward biased and the collector-base junction reversed biased by externally applied voltages. In the BJT, the breakdown voltage of either the emitter-base or collector-base junctions is dependent upon the emitter-base and base-collector doping profiles. The emitter-base profile is limited by tunneling current which if too large can cause a loss of control of the device [Sze, "Physics of Semiconductor Devices," John Wiley & Sons, pp 96–107]. If the emitter-base junction is designed properly, the tunneling current can be limited so that this is not a problem. The collector-base junction is normally operated in a reverse bias mode of operation. This causes the electric field to be very high at this junction. The peak electric field at the collector-base junction is determined by the lowest value of either the collector doping concentration or the base doping concentration. In a standard bipolar transistor, the base 40 is doped higher than the collector 30, so the peak electric field will be determined by the collector doping concentration.

For a high cutoff frequency, the collector resistance and the collector-base space charge layer must be optimized for a given base width 60 and emitter-base doping profile. In the instant invention it will be assumed that the emitter-base doping profile is fixed. Therefore, it is the collector doping profile which is changed to optimize the transistor performance for improving the breakdown voltage of the common-emitter configuration (BVceo) and the ratio of the cutoff frequency to the maximum frequency (Ft/Fmax) for a given technology. Previously, tradeoffs had to be made in optimizing both BVceo and Ft/Fmax. These tradeoffs involved the collector width 70 and the collector doping levels. An optimum BJT will maximize both BVceo and Ft/Fmax. Such optimization and maximization is not possible under current design methodology. There is therefore a need for an improved BJT that simultaneously maximizes both BVceo and Ft/Fmax for optimum performance.

SUMMARY OF INVENTION

The instant invention describes an improved BJT formed by introducing scattering centers into the collector region. The introduction of these scattering centers allows one to simultaneously optimize Bvceo and Ft/Fmax. In particular, the instant invention comprises A bipolar junction transistor, comprising a counterdoped collector region where at least one of the dopant species in the counterdoped collector region has a dopant concentration of greater than $0.5 \times 10^{17}$ cm$^{-3}$.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

This invention involves tailoring the doping profiles in the collector region of a BJT to maximize BVceo and Ft/Fmax. An important element of the instant invention is the creation of scattering centers in the base/collector space charge region. In an embodiment of the instant invention, scattering centers can be introduced in the collector region by using a counterdoped collector region to create a high total impurity concentration, on the order of $10^{-8}$ cm$^{-3}$, while still maintaining a low total active doping concentration, on the order of $10^{16}$ cm$^{-3}$. A high number of scattering centers in the collector will reduce the mean free path of the electrons in the collector. By reducing the mean free path of the electrons, they will pick up less energy in the base/collector space charge electric field. The less energy that the electrons pick up for a given electric field, the lower the number of electrons that have sufficient energy to cause impact ionization will be. By lowering the number of electrons with sufficient energy to cause impact ionization, the breakdown electric field will increase.

Figure 1:
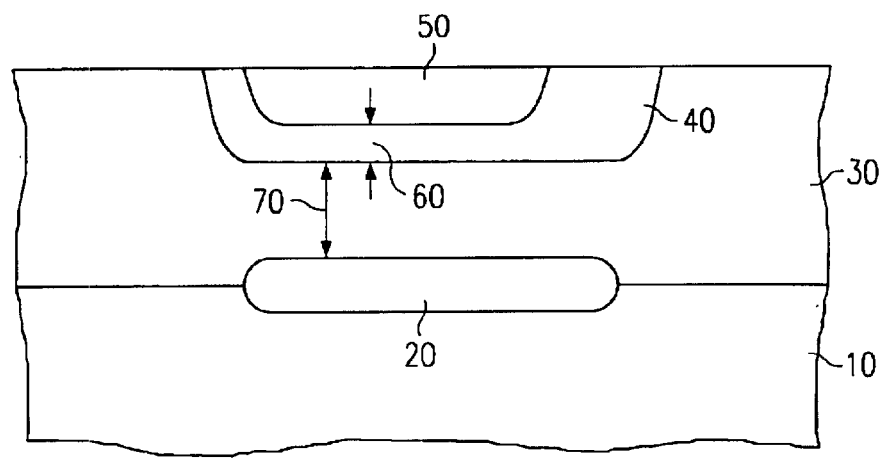
FIG. 1 is a cross-section diagram of a convention BJT.
Figure 2:
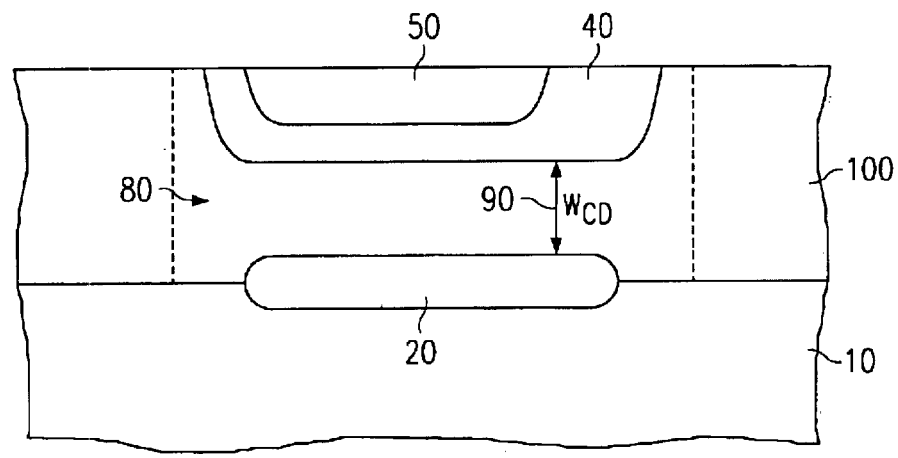
FIG. 2 is a cross-section diagram showing the collector region of a BJT according to an embodiment of the instant invention.

Shown in FIG. 2 is the collector base region of a BJT according to an embodiment of the instant invention. The NPN or PNP bipolar transistor will have a deep buried layer 20 with a high doping concentration so that the collector resistance is minimized. The region of the collector where most of the current flow occurs 80 will have a high concentration of scattering centers. The required concentration of scattering centers will greater than about $0.5 \times 10^{18}$ cm$^{-3}$ for silicon and silicon germanium epitaxial layers 100. In an embodiment of the instant invention these scattering centers can be introduced by counterdoping the collector region. The required concentration of free carriers in the collector region is dependent on the particular transistor application. For the case where the required free carrier concentration is n, then the following relation between the required numbers of donor atoms ($N_D$) and acceptor atoms ($N_A$) holds:

$$n = N_D - N_A \quad (1)$$

where, because of the requirement for the minimum number of scattering centers that must be present, $N_A$ must be greater that $0.5 \times 10^{18} \text{cm}^{-3}$. The value of $N_D$ is therefore given by:

$$N_D > n + 0.5 \times 10^{18} \quad (2)$$

Equation (2) is valid for the case of a NPN transistor. For the case of a PNP transistor a similar relationship holds for the required acceptor concentration given that the required hole concentration in the collector region is p. This relationship is given by:

$$N_A > p + 0.5 \times 10^{18} \quad (3)$$

For the case of silicon and silicon germanium layers 100 the acceptor atoms can be selected from the group consisting boron, aluminum, gallium, indium, and carbon. The donor atoms can be selected from the group consisting of phosphorous, arsenic and antimony. The donor and acceptor atoms can be incorporated into the epitaxial layer 100 during growth or can be introduced by thermal diffusion or ion implantation. In another embodiment of the instant invention, the scattering centers could be formed by the introduction of neutral scattering centers. Here, as in the previous case, the concentration of these neutral scattering centers should be greater that $0.5 \times 10^{18} \text{ cm}^{-3}$. As stated above the introduction of scattering centers in the collector region 80 results in an increase in the breakdown voltage BVceo.

In general as the electric field in semiconductor increases the velocity of the electrons and holes increases. This relationship is fairly linear over low and moderate electric fields. For high electric fields (typically $> \sim 10^5$ V/cm) the velocity of electrons and holes saturates at about $10^7$ cm/s. For electric fields higher than that required for velocity saturation the mobility of the electrons and holes is independent of doping concentration. Therefore as long as the electric field is high enough to cause velocity saturation, increasing the dopant concentration will not affect the transistor performance. In the case of the instant invention, these velocity saturation effects impose addition constraints on the instant invention. The width of the collector region $W_{CD}$ 90 shown in FIG. 2 must be such that under normal operating conditions the depletion region width in the collector region $W_{depcol}$ must be greater that $W_{CD}$. Stated differently, the region in the collector between the collector buried layer 20 and the edge of the base region 40 must be fully depleted during normal operation (i.e. with the collector-base junction reversed biased). Given the improvement in breakdown voltage Bvceo achieved by the inclusion of scattering centers, this requirement of high collector fields and full depletion can easily be achieved by reducing the width $W_{CD}$ 90. Reducing the width $W_{CD}$ will lead to an improvement in the ratio of Ft/Fmax. Until recently, creating a uniform counterdoped layer was extremely difficult without excessive diffusion. As vertical dimensions are being scaled however, the vertical dimensions that new high performance devices are approaching make the use of this idea more manufacturable. Counterdoping using ion-implantation over a 1000 to 1500 Angstrom region is possible to the accuracy required for the instant invention. The value of $W_{CD}$ should therefore be less that about 1500 Angstrom.

Previous BJT designs increase the buried layer distance to the base to increase the breakdown voltage BVceo. They also increase the doping concentration in the collector to try to reduce the onset of the Kirk effect for this wider collector region. This leads to an impossible balance in the collector design to minimize collector resistance, while maintaining a high breakdown voltage. The instant invention offers the following advantages: a) improved breakdown voltage for a given collector geometry; b) improved Ft performance for a given breakdown voltage; c) an added variable for the design of high performance bipolar transistors; d) delays the onset of the Kirk effect by allowing very narrow collectors for a given Bvceo; and e) improves the maximum BVceo * Ft for a given narrow collector bipolar transistor.

Figure 5B:
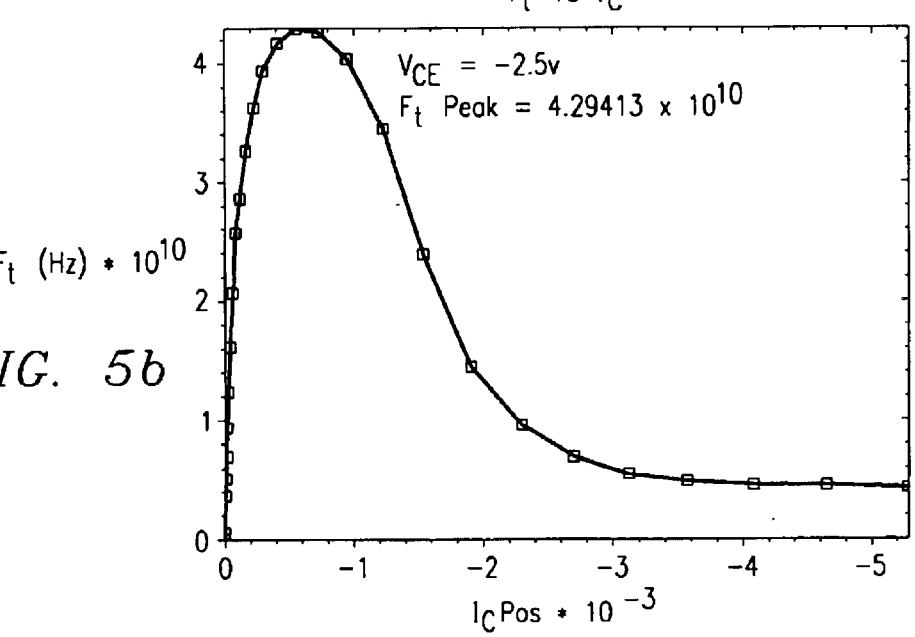
FIGS. 3–5 are simulated curves showing the improvements obtained in BJT performance form an embodiment of the instant invention.
Figure 3:
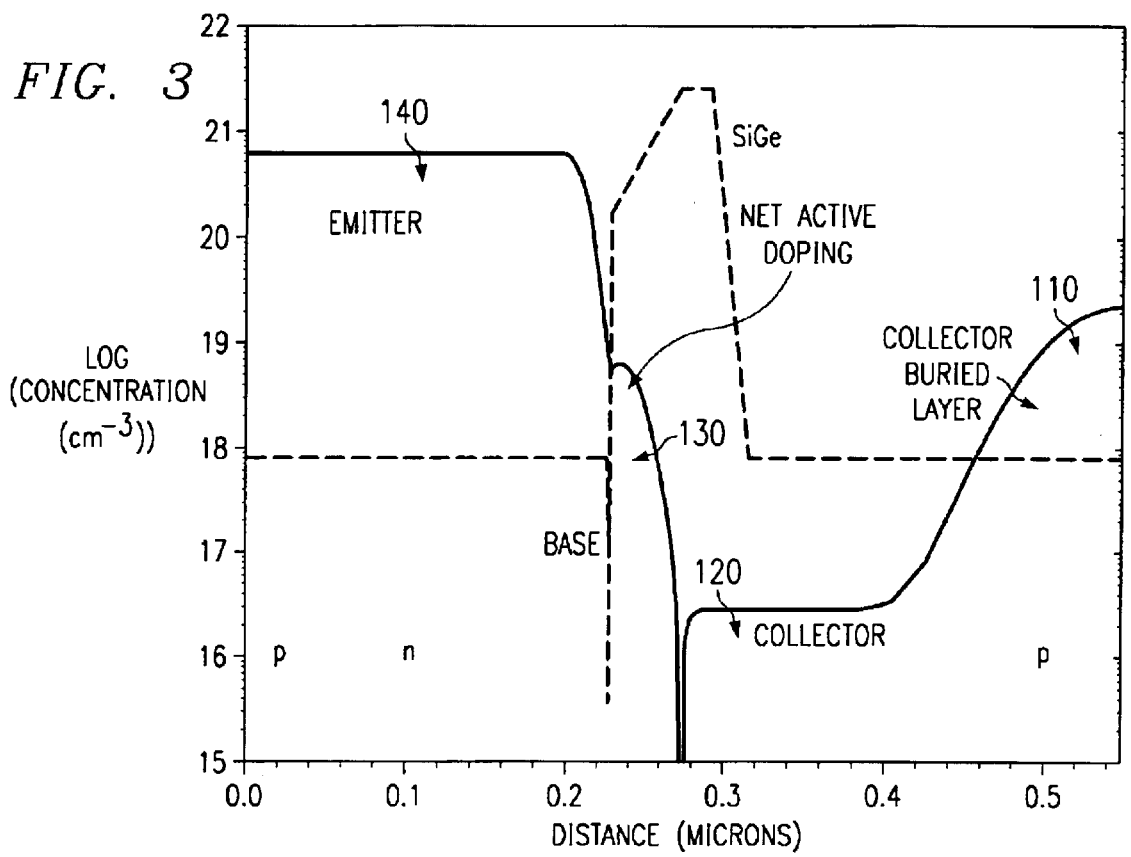
Figure 4A:
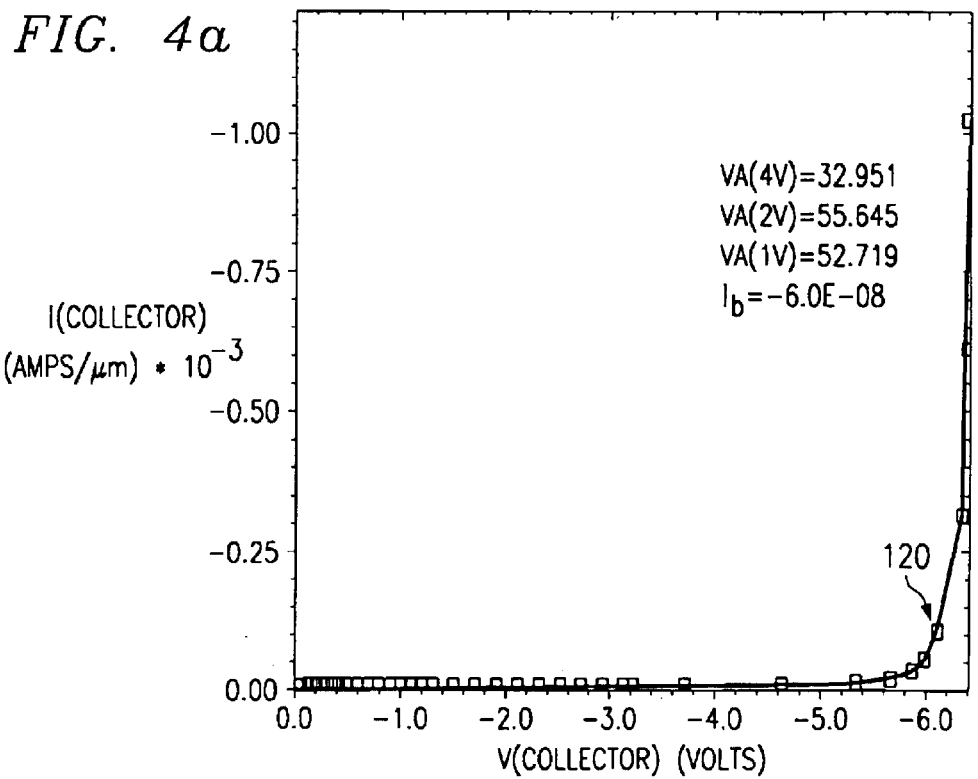
Figure 4B:
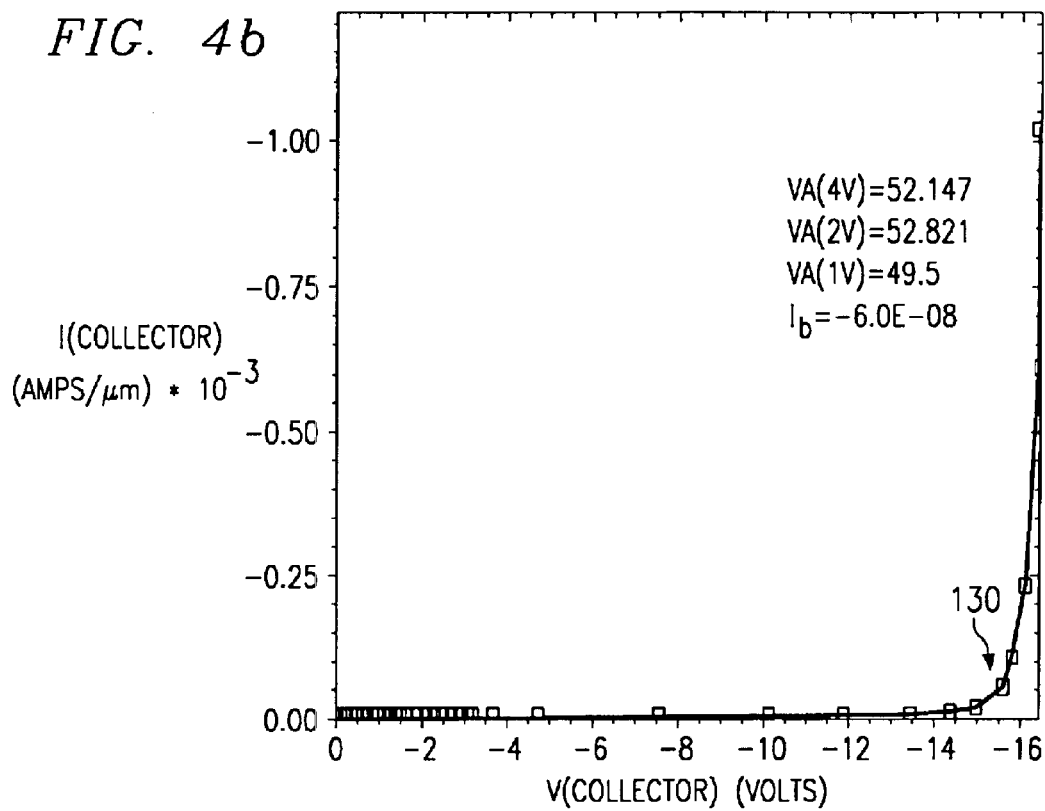
Figure 5A:
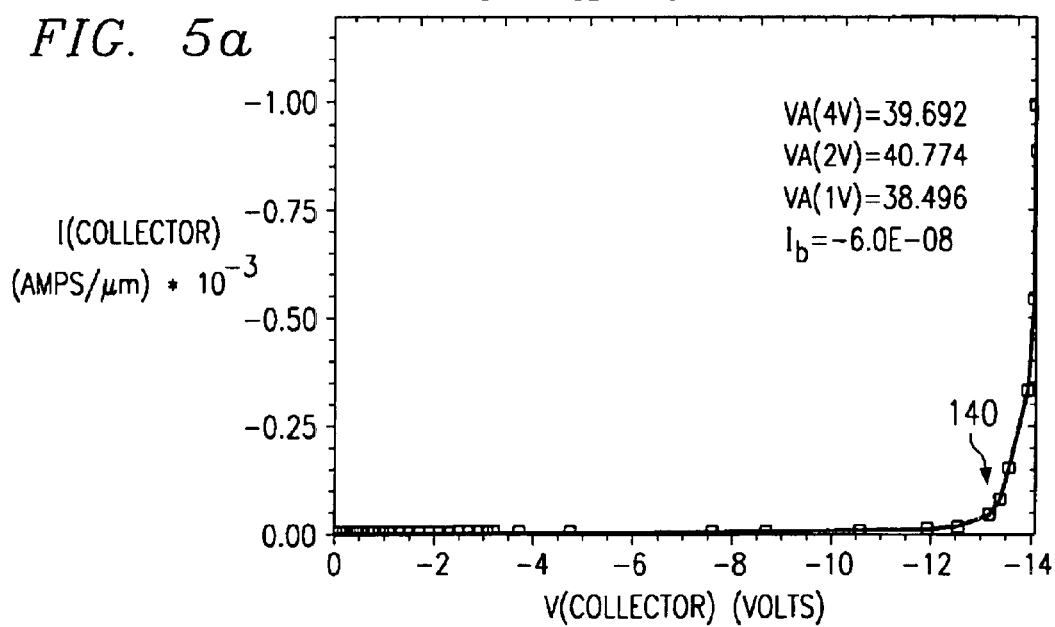

As an example of the device improvements possible using the instant invention, consider the following PNP bipolar transistor simulation where a comparison of device performance with and without the narrow counter doped collector of the instant invention is illustrated in FIGS. 3–5. The simulation was carried out using the standard device simulator Avante' Medici. In FIG. 3, a typical PNP transistor doping profile for a SiGe base transistor is shown. The emitter 140, base 130 and buried collector layer 110 are kept constant in all comparisons. The only variable is the collector 120 doping concentration and the collector width. The doping profile for the collector has a p-type active doping concentration of $3 \times 10^{16}$ cm$^{-3}$. For the counterdoped example, the actual doping in the collector is $9.7 \times 10^{17}$ cm$^{-3}$ of n-type dopant, with $1.0 \times 10^{18}$ cm$^{-3}$ of p-type dopant. For the non-counterdoped results, the collector is doped to $3 \times 10^{16}$ cm$^{-3}$.

Shown in FIGS. 4(*a*) and 4(*b*) are the breakdown voltage curves obtained for the non-counterdoped and counterdoped devices. In the normal non-counterdoped collector shown in FIG. 4(*a*), the breakdown voltage is close to 6 volts 120, whereas for the counterdoped collector shown in FIG. 4(*b*), the breakdown voltage is around 15.5 volts 130, better than 2.5 times higher. For the non-counterdoped collector device the cutoff frequency Ft was calculated to be 42.9 GHz. By reducing the width of the collector of the counterdoped device the high breakdown voltage can be maintained with no degradation in the Ft of the device. This is shown in FIGS. 5(*a*) and 5(*b*) where the width of the collector region was reduced from around 0.15 microns to 0.10 microns and the Ft and breakdown voltage is recalculated. The cutoff frequency was calculated to be about 42.9 GHZ as shown in FIG. 5(*b*) for a breakdown voltage shown in FIG. 5(*b*) to be about 13 volts 140. Thus the counterdoped collector region of the the instant invention will enable improved device performance at a higher breakdown voltage, tremendously improving the BVceo * Ft product for a given transistor design, in this example from 258 GHz-V to 559 GHz-V.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A bipolar junction transistor, comprising:
    a buried collector layer;
    a counterdoped collector region adjacent to said buried collector layer wherein said collector region contains at least $0.5 \times 10^{17} \text{cm}^{-3}$ scattering centers;
    a base region adjacent to said counterdoped collector region; and
    an emitter region adjacent to said base region.

2. The bipolar junction transistor of claim 1 wherein said scattering centers are a species selected from the group consisting of boron, aluminum, gallium, indium, carbon, phosphorous, arsenic and antimony.

3. The bipolar junction transistor of claim 1 wherein the distance from the edge of said buried collector layer which is adjacent to said counterdoped collector region to the edge of said base region which is adjacent to said collector region is less than 1500 angstroms.

4. The bipolar junction transistor of claim 1 wherein the base region is silicon germanium.

5. The bipolar junction transistor of claim 1 wherein the scattering centers of said counterdoped collector region are neutral scattering centers.

* * * * *